(12) United States Patent
Fried et al.

(10) Patent No.: US 6,259,622 B1
(45) Date of Patent: *Jul. 10, 2001

(54) TWO BIT PER CELL ROM USING A TWO PHASE CURRENT SENSE AMPLIFIER

(75) Inventors: Rafael Fried; Tzahi Shalit, both of Caesarea (IL)

(73) Assignee: DSP Group, Inc., Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/348,199

(22) Filed: Jul. 6, 1999

Related U.S. Application Data (60) Provisional application No. 60/091,889, filed on Jul. 7, 1998.

(51) Int. Cl.$^7$ .................................................. G11C 17/00
(52) U.S. Cl. ............................................. 365/94; 365/104
(58) Field of Search ........................................ 365/94, 104

(56) References Cited

U.S. PATENT DOCUMENTS

| | | | | |
|---|---|---|---|---|
| 4,809,224 | * | 2/1989 | Suzuki et al. | 365/104 |
| 5,142,495 | * | 8/1992 | Canepa | 365/104 |
| 5,142,496 | * | 8/1992 | Buskirk | 365/104 |
| 5,197,028 | * | 3/1993 | Nakai | 365/104 |
| 5,943,286 | * | 8/1999 | Orita | 365/189.09 |
| 6,018,487 | * | 1/2000 | Lee et al. | 365/104 |

OTHER PUBLICATIONS

S. Aur et al., "Identification of DRAM sense–amplifiers imbalance using hot–carrier evaluation". IEEE JSSC vol. 27, No. 3, pp. 451–453, Mar. 1992.

T.E. Dillinger, VLSI Engineering, Prentice Hall, New Jersey, 1988, pp. 531–540.

J. Wong et al., "A 45–ns Fully Static 16k MOS ROM", IEEE JSSC, vol. SC–16, No. 5, pp. 592–594, Oct. 1981.

J–H. Park et al., "A 3.3 V 133 Mhz 32Mb Synchronous Mask ROM," ISSCC '1998, pp. 338–339 and 460.

K. Ishibashi et al., "A 12.5 ns 16 Mb CMOS SRAM with Common–Centroid–Geometry–Layout Sense Amplifiers" IEEE ISSC, vol. 29, No. 4 pp. 411–417, Apr. 1994.

K. Ishibashi et al., "A 6ns 4–Mb CMOS SRAM With Offset–Voltage–Insensitive Current Sense Amplifiers", IEEE JSSC, vol. 30, No. 4, pp. 480–486, Apr. 1995.

N.H.E. Weste and K. Schraghian "Principles of CMOS VLSI Design: A System Perspective" $2^{nd}$ Edition Addison-–Wesley, pp. 585–588, 1993.

* cited by examiner

*Primary Examiner*—Trong Phan
(74) *Attorney, Agent, or Firm*—Needle & Rosenberg, P.C.

(57) ABSTRACT

A read only memory (ROM) which is made up of an array and a current sensing circuit. The array is made up of a number of cells each cell being adapted for storing N bits. Each cell has an operative element which is of one of $2^N$ sizes representative of a combination of N bits. The current sensing circuit is connected to the array and senses the size of the operative elements of the array. The current sensing circuit thus differentiates between the $2^N$ sizes of the operative elements to determine the values of each bit of the N bits in each cell. N is an integer greater than 1.

19 Claims, 11 Drawing Sheets

TWO BIT PER CELL ROM USING A TWO PHASE CURRENT SENSE AMPLIFIER

CROSS REFERENCES TO RELATED APPLICATIONS

This application is related to U.S. Provisional patent application Ser. No. 60/091,889 filed on Jul. 7, 1998, incorporated in its entirety by reference herein.

FIELD OF THE INVENTION

The present invention relates to read only memories (ROMs) and more particularly, to Read Only Memories accessed utilizing current sense amplifiers.

BACKGROUND OF THE INVENTION

Read Only Memories (ROMs) have become widely utilized in integrated devices today. They are used, amongst other things, to store data and programs. As the market moves towards system on chip solutions, the need for large on-chip ROMs has increased. The area that is used by these ROMs is usually between 5% and 30% of the overall chip area and can be as much as 50% of the total device area. Thus, the smaller the ROM can be made, the cost thereof will decrease.

The data and programs are stored in the ROM in the form of groups of 1's and 0's (binary code), or bits, known as words. The words are permanently stored, can only be read from the memory, and are typically made up of multiples of 8 bits or bytes. Bits forming words are, in turn, derived from compartments of equal area formed into rows and columns of a ROM array. Each compartment has an address.

Figure 1:
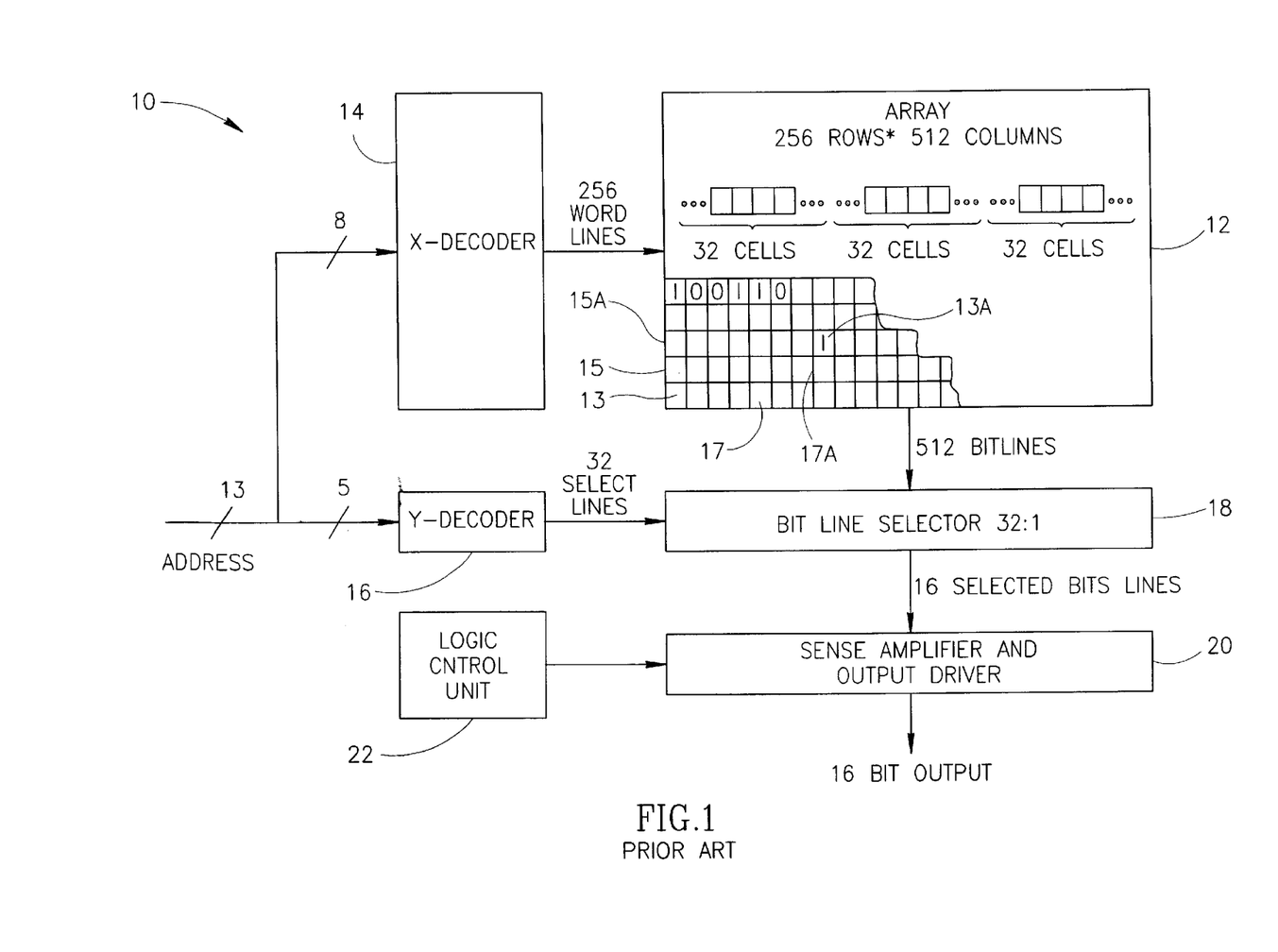
FIG. 1 is a schematic illustration of a prior art read only memory (ROM)

Reference is now made to FIG. 1 which illustrates, by way of example, a 128 Kb ROM 10 in accordance with the prior art. ROM 10 comprises an array 12 containing 8 K words of 16 bits each. The bits of the words are configured as 256 rows and 512 columns within array 12. Each bit of each word is derived from a distinct physical unit or cell 13, equivalent to the compartments, imprinted on a silicon wafer utilizing digital Complementary Metal Oxide Semiconductor (CMOS) technology. A cell has a minimum manufacturable size for a particular process based on the components, e.g., transistors, that are required to be imprinted therein. Cells occur at the cross-section of rows or word lines 15 with column lines or bit lines 17 and are all the same dimensions (and area) for a given array 12. FIG. 1 shows a cell 13A containing a bit of 1 at the intersection of word line 15A with bit line 17A. The location of particular cells 13 correspond to an address on the ROM array 12.

ROM 10 further comprises an X-decoder 14, a Y-decoder 16, a selector 18 and a sense amplifier and output driver 20. X-decoder 14 decodes 8 bits of an address which is the part of the address that determines the correct word line and activates one word line out of 256. The Y-decoder 16 selects a number of columns or bit-lines, corresponding to a word. In the present example, it connects one of every 32 cells 13 in the 16 groups of 32 cells 13 in the activated word line, in accordance with a supplied address. Y-decoder 16 achieves this by driving selector 18, which is, in effect, a switch with multiple inputs. Thus, for each address the 16 bits of a word are selected.

Sense amplifier and output driver 20 then sense whether there is a current in bit-line 17 when connected, i.e., whether a transistor (not shown) exists in each addressed cell 13 (whether the bit is a 1), and outputs the sequence as 16 bit words. If there is no transistor, a zero bit is registered. The sensing amplifier 20 is connected to a logic control unit 22 which controls its operation.

Figure 2:
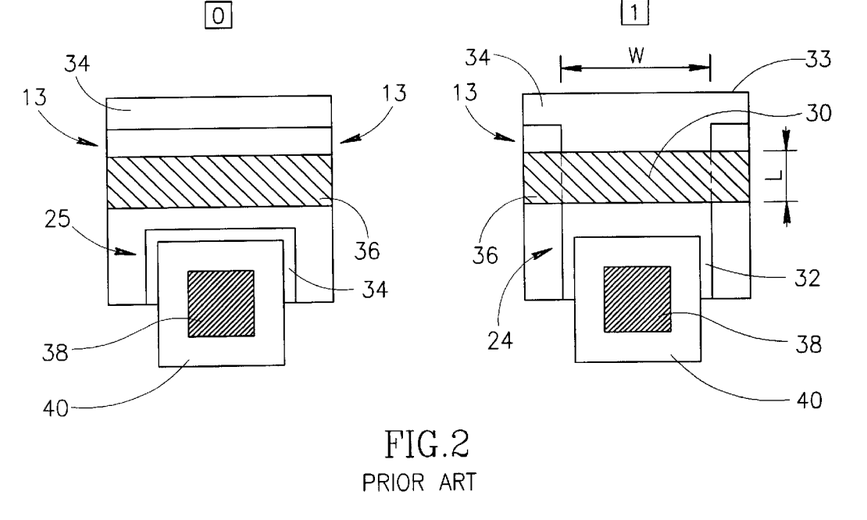
FIG. 2 is a schematic illustration of the cell options for a ROM array in accordance with the prior art.
Figure 3:
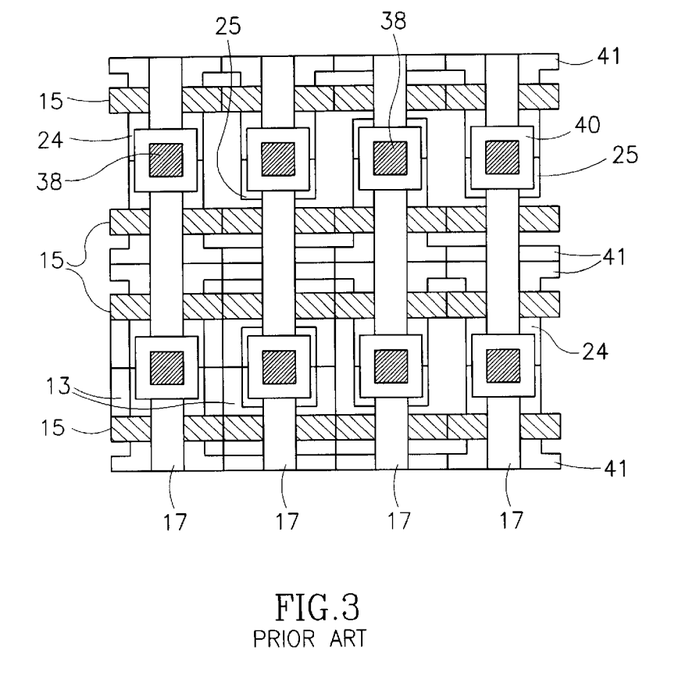
FIG. 3 is a schematic illustration of four by four ROM cells in a ROM array in accordance with the prior art.

Reference is now made to FIG. 2 which is an illustration of a prior art layout of the two basic options for cell 13, that is, both with ad without a transistor. FIG. 3 shows an exemplary layout of four by four ROM cells 13 in an array 12. In FIG. 3, transistors or non-transistors connected to word lines 15, bit lines 17 and a ground connection 41, are shown.

The basic cell 13 contains one transistor 24 or a non-transistor 25 which is made up of the constituent parts of a transistor but not connected to form a transistor. Transistor 24 is formed so that the word line 15 (FIGS. 1, 3) is connected to its gate 30. The drain 32 and source 33 of transistor 24 (with transistor) are connected to the bit line 17 (FIG. 3) and a shared ground 41 (FIG. 3) respectively. The equivalent areas of non-transistor 25 are likewise connected but do not conduct current.

Transistor 24 is composed of a diffusion layer 34 of width W, a polysilicon or poly layer 36 of length, L and a contact 38 overlapped by a metal-1 layer 40. The diffusion layer 34, where it touches with poly 30 at gate 36, forms the active area or channel of transistor 24 and is a measure of the size of transistor 24 in terms of the current it draws. A non-transistor 25 does not have the diffusion layer 34 close to poly layer 36. There is therefore no active area or channel under poly layer 36 in this cell 13.

The minimum width and length, $W_{min}$ and $L_{min}$ of the transistor cell 24 is determined by the minimum allowed transistor size for a specific process. The minimum area of a cell 13, in general, is a function of a number of factors. One of these factors is the overlap of the diffusion layer 34 over the contact width. Therefore, an increase in the width W of diffusion layer 34 may affect the area of cell 13 if it increases this overlap beyond a certain limit. Another factor influencing the minimum area of a cell, 13 is the length, L, of the poly layer 36.

FIG. 3, which is referred to hereinabove and illustrates an exemplary prior art layout of four by four ROM cells 13 in an array 12, is now further referred to. The rows of memory cells 13, comprising non-transistors 25 and transistors 24 share the same word line 15 as shown. Each transistor 24 or non-transistor 25, of a row is shown connected to a different column or bit line 17. When a word line 15 is activated, only those cells in that row which contain a transistor 24 will conduct current from their bit line 17 to group 41 (or to a virtual ground or to a reference). Which of the cells has a transistor 24 can be determined by sensing the currents on the bit lines 17. The needed data is conveyed by pre-programming the location of the transistors in the array. As is illustrated, two basic cells 13 share the same contact 38 and all the contacts are connected together by the metal line of bit line 17. The shared ground line 41 formed by the meeting of diffusion layers 34 from two transistors 24 or non-transistors 25 is connected to ground by a metal line (not shown), for example, every 16 cells in order to save space.

SUMMARY OF THE INVENTION

An object of the present invention is to provide multiple bit storage in a single cell of a ROM array.

A further object of the present invention is to provide means for sensing differences in size of ROM array operative elements or transistors in order to differentiate multiple bit sequences in a single cell of a ROM array.

There is thus provided a read only memory (ROM) which is made up of an array and a current sensing circuit. The array consists of a number of cells each adapted for storing N bits. Each cell has an operative element which is of one of $2^N$ sizes. The current sensing circuit is connected to the array and senses the sizes of the operative elements of the array. The current sensing circuit thus differentiates among $2^N$ sizes of operative elements to determine the values of each bit of the N bits of the cells of the ROM array. N is an integer greater than 1. Each operative element may further be a transistor.

Furthermore, the current sensing circuit is made up of a comparator, a reference cell and a bit line selector. The comparator includes a first branch and a number of second branches each of the second branches carrying a current. The first and second branches include one or more transistors connected to each other. The second branches may be only one branch.

The reference cell has a predetermined current level and is connected to the first branch of the comparator. The bit line selector is able to be connected to any number of the second branches of the comparator. Further, the first branch includes a transistor.

There is further provided a ROM array which is made up of a number of cells each of which is adapted for storing N bits. Each cell has an operative element sized to have one of $2^N$ sizes. The operative elements may further be transistors. N is an integer greater than 1.

Further the ROM array is also made up of a current sensing circuit. The current sensing circuit is connected to the ROM array. The current sensing circuit senses the size of the operative elements of the array and differentiates among $2^N$ of the sizes of the operative elements to determine the values of each bit of the N bits of each cell. The current sensing circuit is further made up of a comparator, a reference cell and a bit line selector. The comparator is made up of a first branch containing one or more interconnected transistors and connected to a reference cell. The reference cell has a predetermined current level. The comparator is further made up of one or a number of second branches each of which carries a current and each of which contains one or more interconnected transistors. The bit line selector is able to be connected to to one or more of the second branches of the comparator.

There is further provided a method for accessing N bits per cell in a ROM. The method is made up of the steps of forming an array, sensing the size of the operative elements of the array and differentiating among $2^N$ of the sizes of the operative elements to determine the values of each bit of the N bits of each cell of the array. The step of forming the array includes making the array of many cells where each cell is adapted for storing N bits. Each cell has an operative element sized so as to have one of $2^N$ sizes. N is greater than 1.

The step of differentiating is further made up of a number of steps. The first step if recursively splitting the $2^N$ sizes of operative element into a larger half and a smaller half. The second step is made up of recursively isolating a chosen half of the larger and the smaller recursively split half which contains the operative element. The second step further includes recursively measuring a voltage drop through an operative element. The voltage drop is representative of the relative sizes of a median size which is between the larger recursively split half and the smaller recursively split half on the one hand and the operational element being examined. The recursive splitting and the recursive isolating steps occur N+1 times.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

Figure 4:
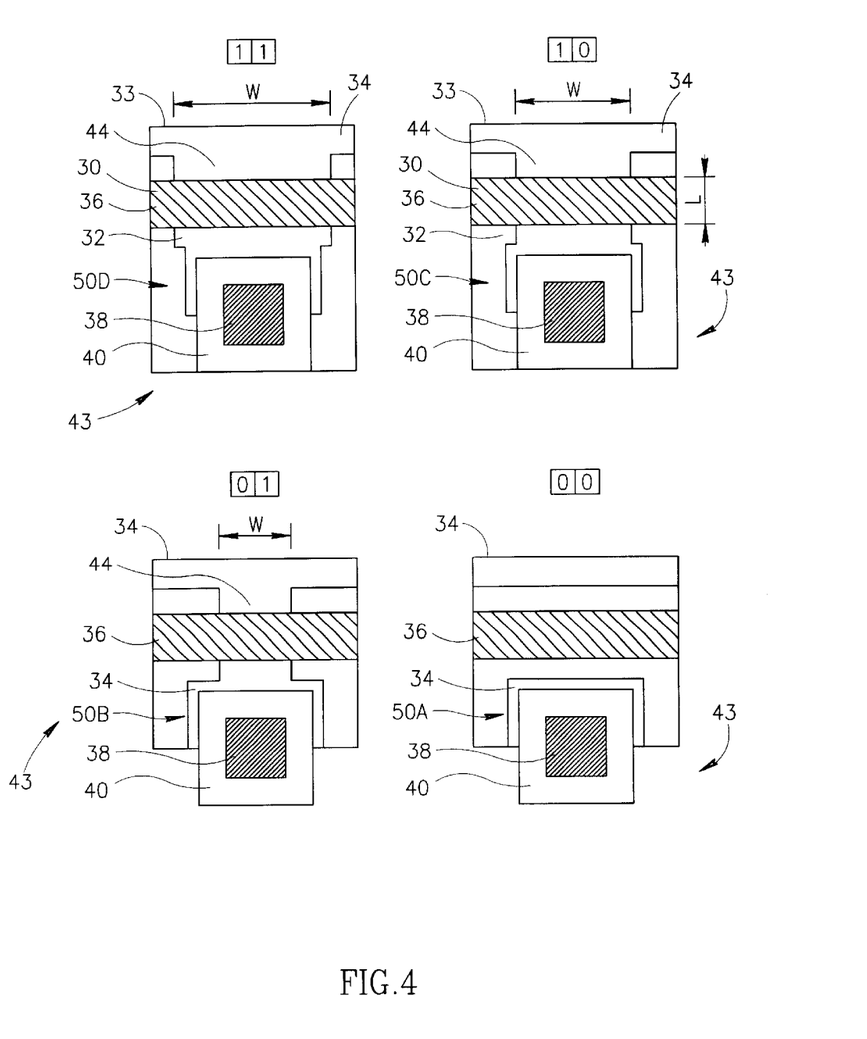
FIG. 4 is a schematic illustration of the structure of the four different array cell options in the ROM in accordance with a preferred embodiment of the present invention.
Figure 5:
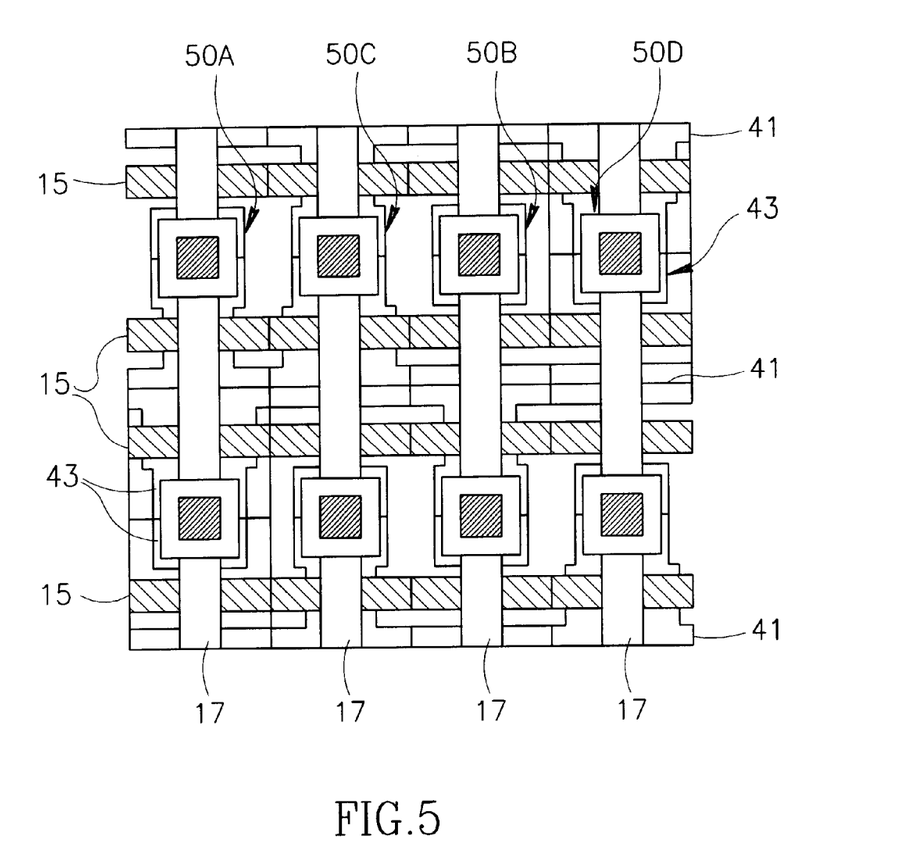
FIG. 5 is a schematic illustration of an exemplary layout of four rows and four columns of the array cells of the ROM in accordance with a preferred embodiment of the present invention.
Figure 6:
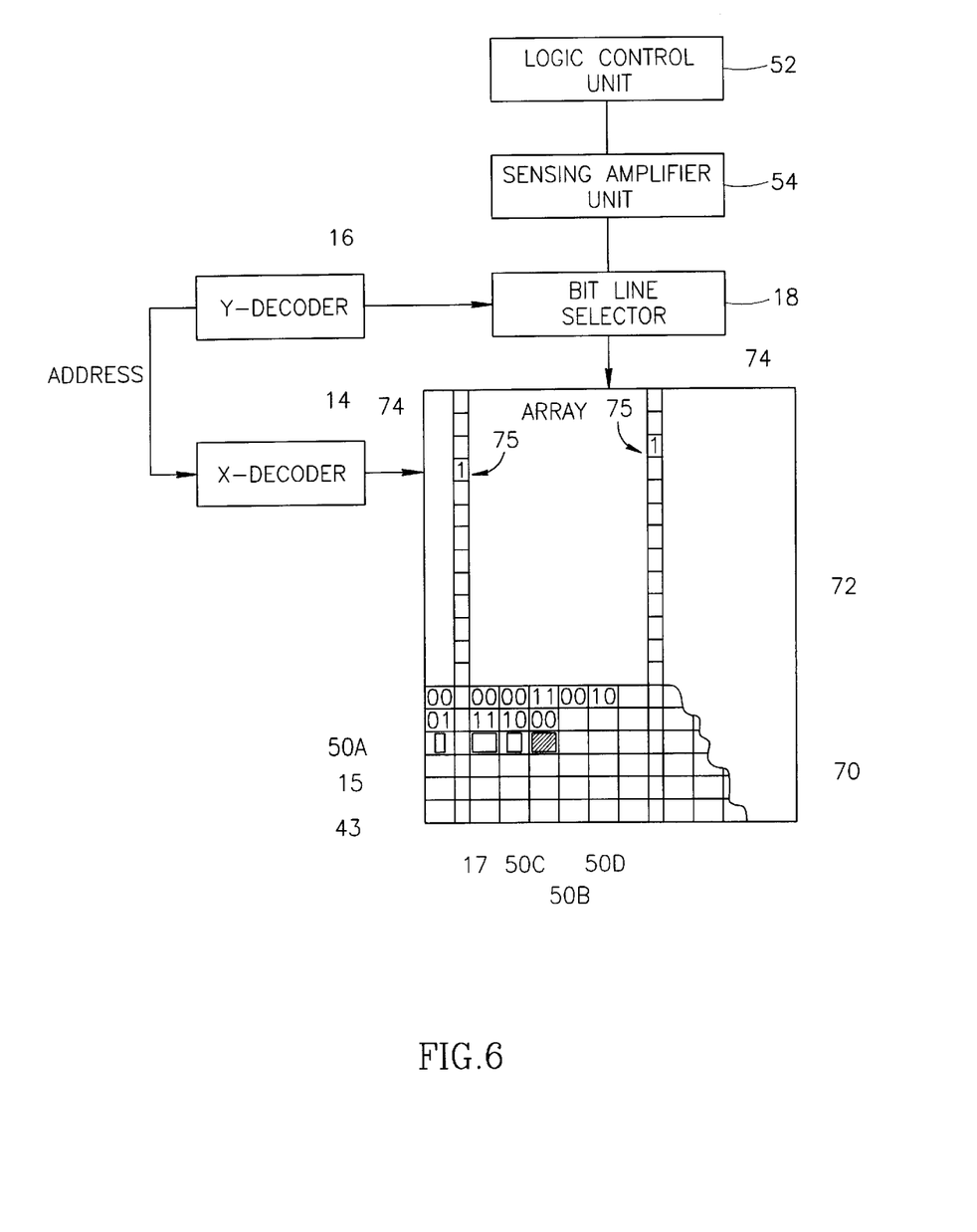
FIG. 6 is a schematic illustration of a ROM for storing more than one bit per array cell in accordance with a preferred embodiment of the present invention.

Reference is now made to FIGS. 4, 5 and 6 which are illustrations of a ROM 70 in accordance with an embodiment of the present invention. FIG. 4 is a schematic illustration of the cell options for a ROM array in accordance with an embodiment of the present invention. FIG. 5 is a schematic illustration of four by four ROM cells in a ROM array in accordance with an embodiment of the present invention. FIG. 6 is a schematic illustration of the ROM array in accordance with an embodiment of the present invention. Items similar to those in previous figures have similar numerals and are in accordance with that described above, and will not be further described.

There are illustrated in FIG. 4 four cells 43 (of equal size, as is usual). The four cells 43 contain four operative elements or transistors 50A–50D of increasing size (corresponding to increasing current passed or drawn).

Transistor 50A is, in fact, a non-transistor (incapable of passing current) as described hereinabove but will be termed a transistor that conducts no current or a transistor of zero size for ease of reference. As mentioned above, the size of a transistor (and the magnitude of the current it can pass) is determined by the size of its active area or channel, for a given gate and drain voltage. The four different sizes (determined by the width, W, of a diffusion layer 34, as the length of a poly layer 36 is kept constant in this example)

each correspond to a combination of bits and together encompass all possible double combinations of 1 and 0, as illustrated. By differentiating different currents passed or drawn by the different sizes of memory transistors 50A–50D in a ROM 70 (FIG. 6) each of the bit combinations may be differentiated, thereby increasing the "bit yield" per cent 43 from 1 to 2. This yields an attendant maximum saving in the size of a ROM array 72 (FIG. 6) of 50% for 2 bits per cell. In face cells 43 are usually slightly bigger than the minimum size of ROM array 13 to accommodate the largest of the four memory transistors 50D but the doubling in the bits stored leads to a 40%–50% saving in the overall area of ROM array 13.

The different currents are differentiated using a 2-phase current sensing amplifier unit 54 (FIG. 6). In phase 1, sensing amplifier 54 uses the current through a reference transistor 74 in a reference cell 75 to discriminate between the two largest (50C and 50D) and the two smallest memory transistors (50A and 50B) in cells 43. In phase 1, a current of a magnitude between that passed by the biggest two transistors (50C and 50D) on the one hand and that passed by the smallest two memory transistors (50A and 50B) on the other hand is the reference current and reference transistor 74 is chosen accordingly. If the voltage drop on chosen memory transistor 50 is lower than that of the reference transistor 74, a Most Significant Bit (MSB) of 1 is stored indicating that one of the two largest memory transistors (50C and 50D) is being sensed. If the voltage drop is higher, an MSB of 0 is stored indicating that one of the two smaller memory transistors (50A and 50B) is being sensed.

In the second phase, the MSB is utilized by logic control unit 52 (FIG. 6) to select either a larger reference transistor 74 (FIG. 6) corresponding to a higher current or a smaller reference transistor 74 (if MSB is 0) corresponding to a lower current, depending on which pair of memory transistors 50 was selected in phase 1. The higher and lower currents correspond to the median current passed by either the cells 43 containing the two largest memory transistors 50 (50C and 50D) or the cells 43 containing the two smallest memory transistors 50 (50A and 50B). Thus, the higher reference current will be between that passed by transistors 50C and 50D and the lower reference current will be between that passed by transistors 50A and 50B. This enables a further elimination of either one or memory transistors 50A and 50B or memory transistors 50C and 50D depending on which pair was chosen in phase 1. This is achieved by measuring if a higher or lower voltage drop than that across reference transistor 74 is produced across memory transistor 50, selected from array 72 (FIG. 6).

This process occurs in a similar fashion to phase 1 and yields a Least Significant Bit (LSB) of 0 if the lower sized memory transistor 50 of either of the two pairs is identified and an LSB of 1 if the higher sized of either of the two pairs is identified. Hence, each memory transistor 50 in each cell 43 of ROM array 72 yields two bits.

Turning specifically to FIG. 4, the four different memory transistor options 50A–50D in cells 43 containing transistors of increasing size are described. The diffusion layer 34 of each memory transistor 50 is of a width, W. The poly layer 36 is of length, L. The width, W, of memory transistor 50 is varied to vary the active area (or channel) of the memory transistor 50. This produces a variation in the magnitude of the voltage drop for a given current through bit-line 17. The voltage drop (for a given current) is highest for memory transistor 50A (FIG. 5) progressing to lowest for memory transistor 50D. The word line 15 is connected to the gate 30 of each memory transistor 50. The drain 32 and source 33 of memory transistor 50 are connected to the bit line 17 and a shared ground 41 respectively (FIG. 5). As previously mentioned, no current can flow through memory "transistor" 50A, as no transistor is formed in cell 43.

The memory transistors 50 may be arranged in a four by four formation, as shown in FIG. 5. The first row comprises memory transistors 50A, 50C, 50B and 50D illustrating their respective sizes or widths, W, of diffusion layer 34. Thus, bits corresponding to the combinations 00, 10, 01 and 11 will be given by the top row (left to right) in this arrangement. The shape of cells 43 is also shown.

The four options of transistor sizes are as follows:

| Reference number of cell on FIG. 4 | Translator Size | Bit output | Option number |
|---|---|---|---|
| 50A | No transistor | 00 | Option 1 |
| 50B | $W_{min}/L_{min}$ | 01 | Option 2 |
| 50C | $2*W_{min}/L_{min}$ | 10 | Option 3 |
| 50D | $3*W_{min}/L_{min}$ | 11 | Option 4 |

Where $W_{min}$ and $L_{min}$ define the minimum allowed memory transistor 50 size in terms of width, W, of diffusion layer 34 and length, L, of poly 36 for a specific process of CMOS chip manufacture.

To accommodate the largest of the four options, namely memory transistor 50D, all array cells 43 in the present example, must be 20% wider than conventional cells 13. This is so since the cells 43 need to be capable of accommodating an option of a memory transistor 50 which is three times the minimum width, $W_{min}$, of a transistor as defined above. However, as the data carried by ROM array 72 is doubled the are saving in array 72 is approximately 40%.

Other options of memory transistor sizes 50 may be chosen in accordance with the need. For example, the following four memory transistor 50 size options may be used when a current path to ground is needed for ALL the options of memory transistors 50.

| | |
|---|---|
| 50A: $W_{min}/L_{min}$ | (Option 1) |
| 50B: $2*W_{min}/L_{min}$ | (Option 2) |
| 50C: $3*W_{min}/L_{min}$ | (Option 3) |
| 50D: $4*W_{min}/L_{min}$ | (Option 4) |

It should be noted that 50A now represents an active transistor and not a "non-transistor". A current path to ground is required for all the cell options, for example, when the detection is combined with an additional metal or via programming to achieve an even higher number of data bits per cell 43.

Other cell 43 options can involve changing BOTH the width, W, and the length, L, of diffusion layer 34 and poly layer 36 respectively, of memory transistors 50. This can lead to a smaller array 72 area for some processes. In this case an exemplary set of options could be:

| | |
|---|---|
| 50A: no transistor | (Option 1) |
| 50B: $W_{min}/L_{min}$ | (Option 2) |
| 50C: $2*W_{min}/L_{min}$ | (Option 3) |
| 50D: $W_{min}/2*L_{min}$ | (Option 4) |

This may result in a smaller array for some manufacturing processes. Further, the differences in size between the memory transistors 50 may be changed so that, for example, the steps in size are less than $W_{min}$, so that the biggest memory transistor 50D is the same size as the memory transistor 24 in a conventional cell 13. The area saving in array 72 over conventional array 12 may thus be increased from 40% to 50% (i.e there is no cell 43 area penalty for accommodating memory transistor 50D) with the disadvantage that the circuit may be a little less robust.

Figure 7:
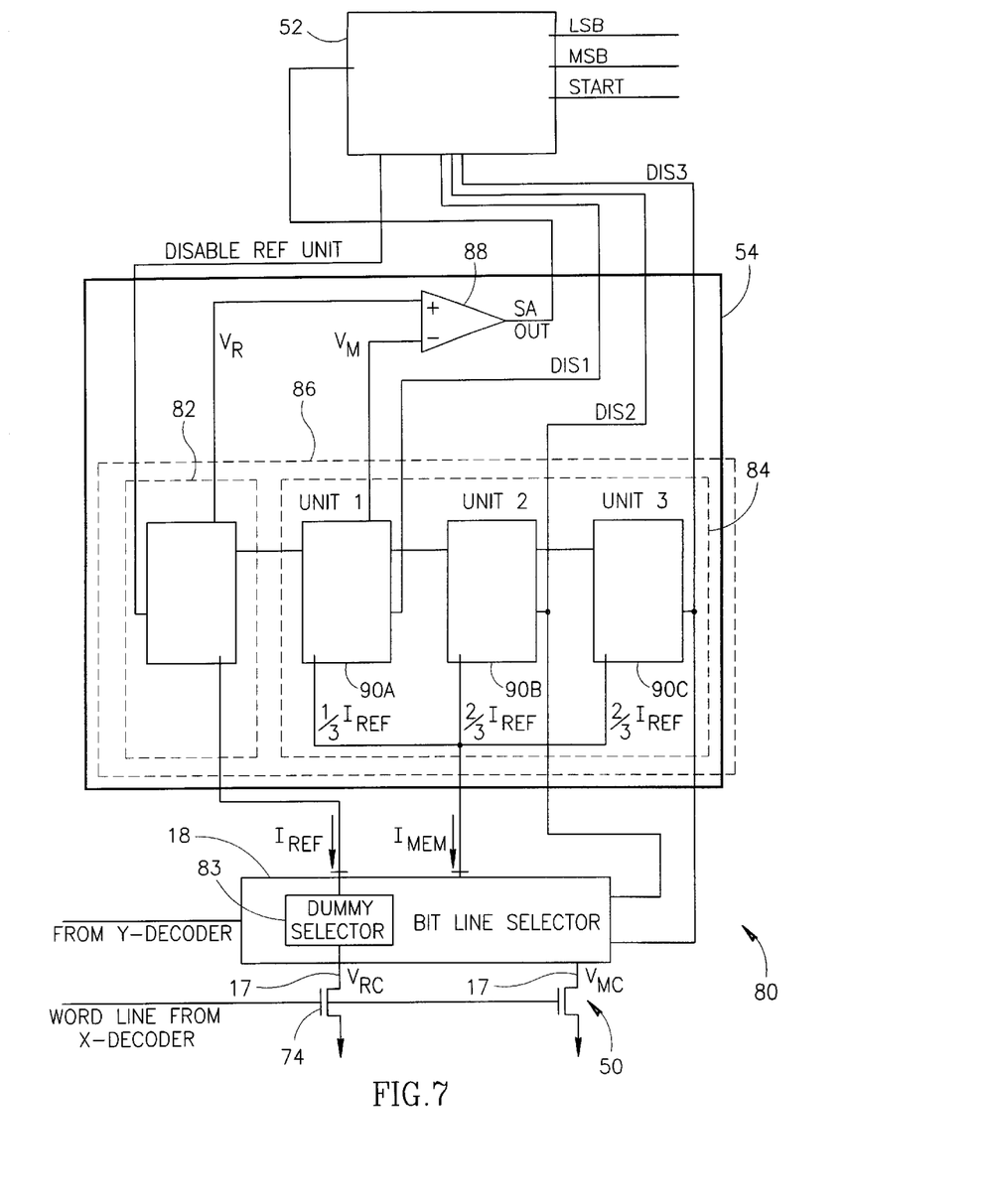
FIG. 7 is a schematic illustration of the circuitry of the ROM in accordance with a preferred embodiment of the present invention.

Reference is now made to FIG. 7 which illustrates the circuitry 80 of ROM 70 in accordance with an embodiment of the present invention. Items similar to those in previous figures carry similar reference numerals and will not be described further. Circuit 80 comprises two main branches 82 and 84 which form the basis of a current mirror circuit 86 for equalizing the current through a reference transistor 74 and a connected transistor 50 of array 72 (FIG. 6) in order to make a size comparison which is measured by a voltage drop. Branch 82 is connected to reference transistor 74 via a bit line 17 through a dummy selector 83. Thus, branch 82 is always connected to reference transistor 74. Branch 84 is connected to selected memory transistor 50 via a bit line selector 18. Branch 82 may be termed the reference branch and branch 84 may be termed the memory branch.

A word line signal from x-decoder 14 (FIG. 6) selects a word line 15 (FIG. 5) and a bit-line signal from y-decoder 16 (FIG. 6) instructs bit line selector 18 to select a particular memory transistor 50A, 50B, 50C, 50D (FIGS. 4,5) from array 72 in accordance with an address. Reference transistor 74 is always joined to branch 82 via a dummy selector 83. Thus, reference transistor 74 and a memory transistor 50 are respectively joined to branch 82 and branch 84 of current mirror circuit 86. The current flowing in branch 82 and branch 84 may be labelled $I_{ref}$ and $I_{mem}$ respectively. The ultimately measured voltages in branches 82 and 84 are $V_r$ and $V_m$ respectively, and these differ from the voltages at cells 74 and 50 termed $V_{rc}$ and $V_{mc}$ respectively. The differences in $V_r$ and $V_{rc}$ on the one hand and $V_m$ and $V_{mc}$ on the other hand are due to a de-coupling effect which occurs within current mirror 86. However, the relationship between them, that is, which of them is larger than the other remains the same.

The differences in $V_r$ and $V_m$ are sensed in differential amplifier 88 to produce an MSB or an LSB based on whether $V_m$ or $V_r$ is larger in each of the two phases of detection, as described hereinabove in terms of current. The voltage relationship will be described further hereinbelow.

The size of reference transistor 74 is fixed at the midpoint in size terms between the sizes of memory transistors 50A–50D. Therefore, since in the present example memory transistor 50B is of size $W_{min}/L_{min}$ and memory transistor 50C is of size $2*W_{min}/L_{min}$, the size of reference transistor 74 is set at $1.5*W_{min}/L_{min}$. For the second phase, $I_{mem}$ is adjusted to stimulate a change in the size of reference transistor 74, rather than actually physically changing it. There are therefore three units 90A, 90B and 90C connected in parallel which pass different currents and are activated alone or in combination to simulate the required median reference currents (reference transistor 74) for comparison in the second phase of sensing. Thus, in the second phase of sensing if the MSB is zero, $I_{mem}$ will be adjusted to simulate a size of reference transistor 74 of $0.5*W_{min}/L_{min}$, which is halfway between the sizes of memory transistors 50A and 50B. However, if the MSB is 1, a memory transistor 50 of a size between the sizes of memory transistors 50C and 50D will be simulated, namely $2.5*W_{min}/L_{min}$.

Logic control unit 52 controls the operation of circuit 80 by activating the circuit, registering the LSB and MSB and activating the appropriate units 90A, 90B and 90C when it switches the circuit between phase 1 and phase 2.

Figure 8:
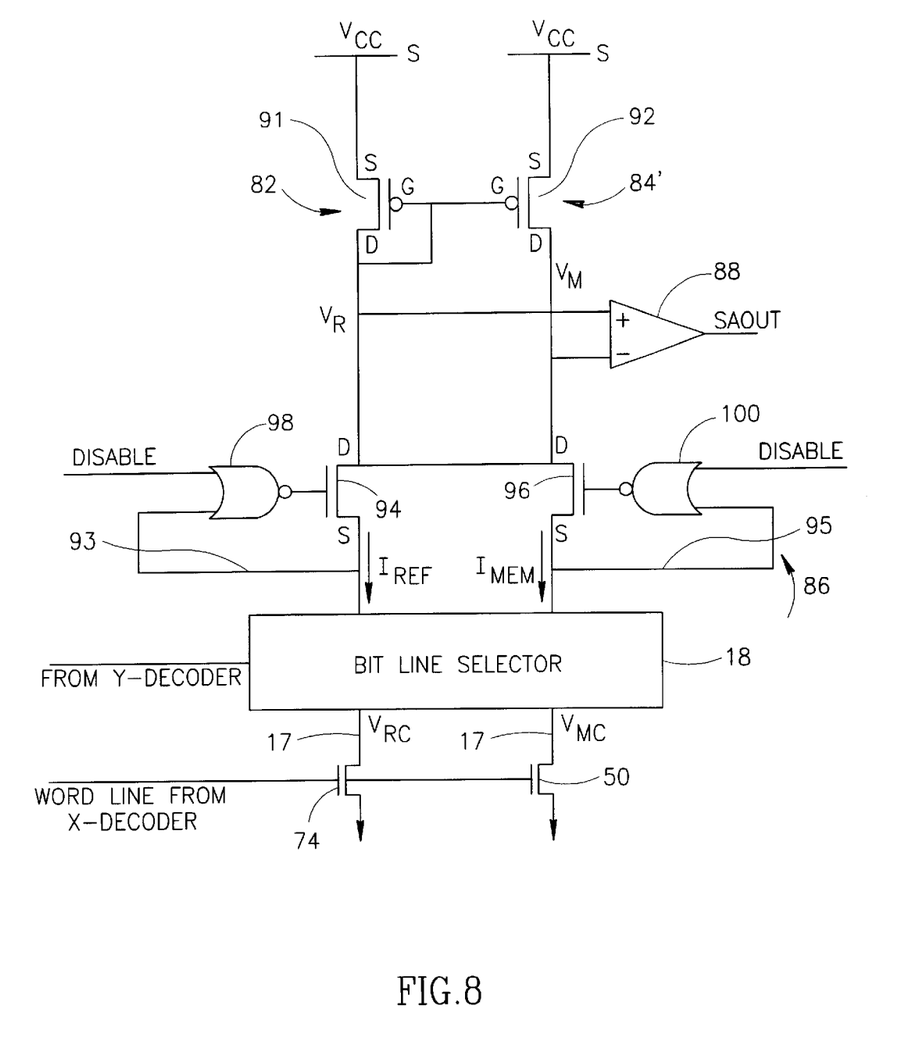
FIG. 8 is a schematic illustration of the basic current mirror sensing circuit for differentiating between transistor sizes in accordance with a preferred embodiment of the present invention.

Reference is now made to FIG. 8 which illustrates the construction and operation of current mirror 86. Items similar to those shown in previous figures have similar reference numerals and will not be described further. Branch 84' is a representation of the combined effect of units 90A, 90B and 90C for explanatory purposes. Branches 82 and 84' are respectively connected to a positive voltage terminal at a voltage of $V_{cc}$.

As described hereinabove, a reference transistor 74 and one of four sizes of memory transistor 50 are connected via bit line selector 18 to branches 82 and 84' of mirror circuit 86 and a current of $I_{ref}$ and $I_{mem}$ flows in each respective branch 82 and 84'. Circuit 86 equalizes the current in memory transistor 50 with that in a reference transistor 74 utilizing a current mirror configuration. Thus, the size of the memory transistor in cell 50 may be ascertained based on the voltage drop across it, as described hereinabove. A current mirror configuration is one in which the current in branches 82 and 84' where the comparison is made, remains constant. Thus, the voltage, $V_m$ in branch 84' changes, due to an increase or decrease in size of memory transistor 50.

What this means is that when the reference transistor 74 is the same size as memory transistor 50, $I_{ref}=I_{mem}$, $V_{rc}=V_{mc}$ and $V_r=V_m$. The circuit is thus balanced. However, when memory transistor 50 is larger than reference transistor 74 it tries to draw more current. This is compensated for by branch 84' of mirror circuit 86 so that the current remains the same, causing instead a decrease in $V_{mc}$. Thus, since the current is held constant, the voltage $V_m$ follows the increase or decrease in size in memory transistor 50.

The basic mirror portion of circuit 70 comprises two P-channel Metal Oxide Semiconductor (PMOS) transistors 91 and 92 respectively placed in branch 82 and 84' of mirror circuit 86 with, in the simplest example, the same gate width and length. The sources, S, of transistors 91 and 92 are each connected to the positive voltage $V_{cc}$.

The gates, G of transistors 91 and 92 are connected to each other. The gate, G of transistor 91 is connected to its drain, D and both of transistors 91 and 92 are in their saturation region. $V_r$ and $I_{ref}$ are the voltage and current in reference branch 82 above bit line selector 18 and $V_m$ and $I_{mem}$ are the voltage and current in memory branch 84' above bit line selector 18 as described above. The voltages $V_r$ and $V_m$ follow $V_{rc}$ and $V_{mc}$ at the reference transistor 74 and memory transistor 50 respectively but are not the same due to the decoupling between them mentioned above and described more fully below.

Since both transistors 91 and 92 are in their saturation region and are the same size, they will both supply the same current, regardless of the voltages $V_r$ and $V_m$ on their respective drains, D. The circuit is balanced if the size of the reference transistor 74 is the same as the size of memory transistor 50. Thus, if memory transistor 50 is larger than the reference transistor 74, this will be manifested in a decreased $V_{mc}$ and will upset the balance of the mirror circuit 86. This is so since $V_{mc}$ is related to $V_m$, albeit in a decoupled way. The increase in size of memory transistor 50 will be represented in the decrease in $V_m$.

Thus, the constant current condition enables a comparison between the voltage, $V_{rc}$, across reference transistor 74, and the voltage, $V_{mc}$, across memory transistor 50, which is related inversely to their relative sizes, as described above. If memory transistor 50 is larger, $V_{mc}$ will be smaller than $V_{rc}$ and the converse is true if memory transistor 50 is smaller. Further, since the voltages are relative, errors which are uniform in both branches 82 and 84' do not affect the accuracy of the result.

Connected to the basic mirror circuit, that is, transistors 91 and 92 respectively are two N-channel Metal Oxide Semiconductor (NMOS) transistors 94 and 96 in each branch 82 and 84' of circuit 86. Transistors 94 and 96 are connected via their respective branches to reference transistor 74 and memory transistor 50. Connected to transistors 94 and 96 are NOR gates 98 and 100 respectively. There are two inputs to each NOR gate 98 and 100 one of which is connected to the source, S, of transistors 94 and 96 respectively.

The role of transistors 94 and 96 is a dual one. Firstly, on receipt of a disable signal, 1, from logic control unit 52 they disconnect sense amplifier, 54 from bit line selector 18 by switching off. Secondly, they control the voltage on bit lines 17, by means of a feedback loop, to enable sense amplifier 54 to stabilize and produce a result more speedily. The NOR gate feedback inputs are set to keep the voltage of the reference transistor 74, $V_{rc}$ under 1V (assuming that the voltage drop on the bit line selector 18 is negligible). When there is no disable signal, the second inputs 93 and 95 to NOR gates 98 and 100 determine the current flowing through transistors 94 and 96 from the basic mirror circuit.

Hence, the principle of operation of mirror circuit 86 is that if the reference branch 82 is mirrored exactly to the memory branch 84' (i.e. the size of transistors 91 and 92 are the same and the size of transistors 94 and 96 are the same) and the memory transistor 50 is the same size as the reference transistor 74, the circuit will be completely balanced and $V_m$ will be equal to $V_r$. As described above, in practice, the memory transistor 50 is either bigger or smaller than the reference transistor 74, causing a slight shift in $V_{mc}$. The NOR gate negative feedback minimizes the shift (to as low as 10 mV in some cases) by changing $I_{mem}$, the current in the memory branch 84' and $V_m$. $V_m$ is balanced between two transistors 91 and 92 in the saturation region, so the needed change in $I_{mem}$ causes a shift of at least 500 mV in $V_m$ and is easily detected by differential amplifier 88. In this configuration $V_m$ can shift very quickly because it is decoupled from bit line 17 ($V_{mc}$) which has a high capacitance and shifts very little. Again, it is emphasized that $V_m$ shifts inversely to the change in the size of memory transistor 50.

Figure 9:
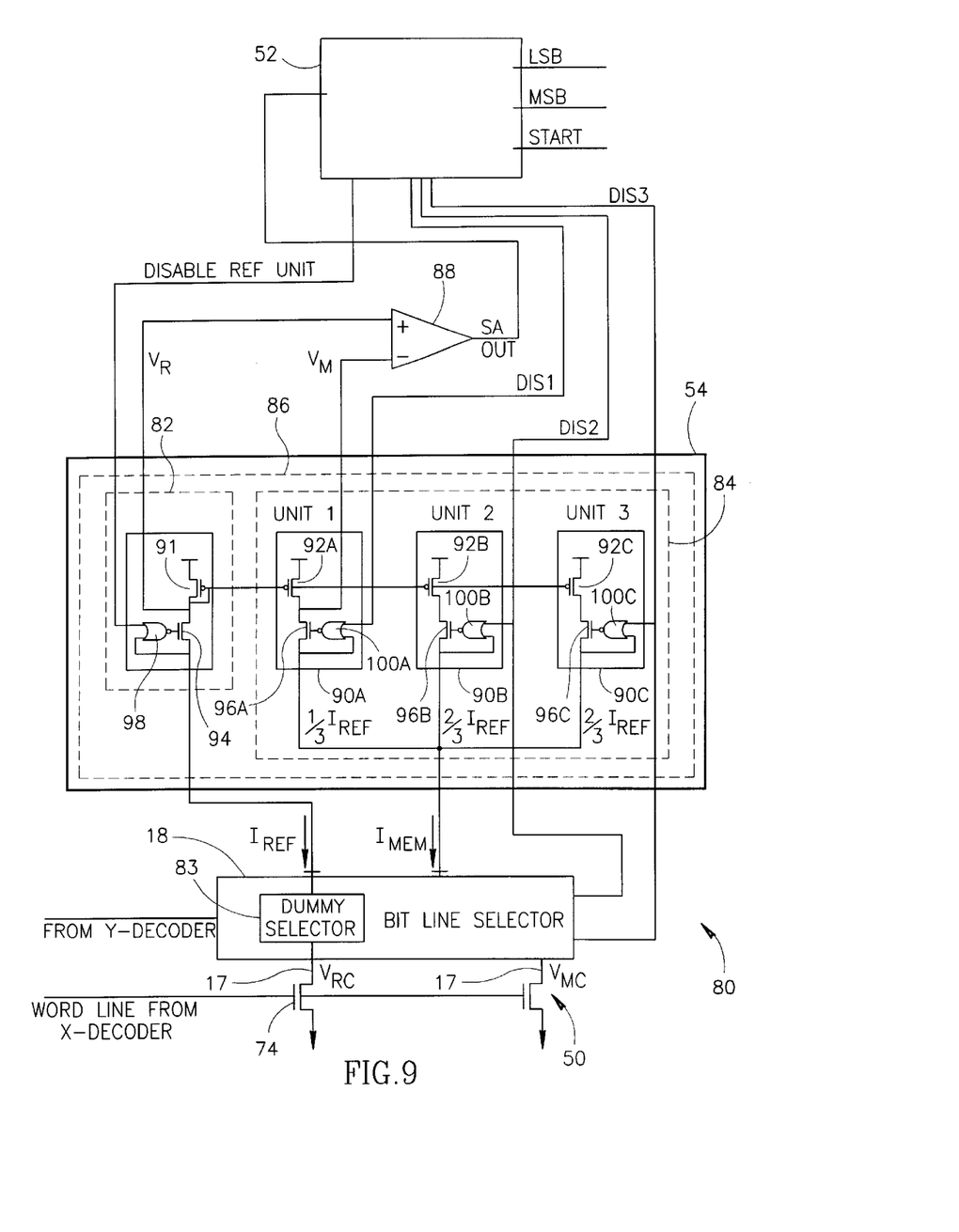
FIG. 9 is a further schematic illustration of the circuitry of the ROM illustrating the constituent parts of the memory branch in accordance with a preferred embodiment of the present invention.

Reference is now made to FIG. 9 which further illustrates the circuitry 80 of ROM 70 indicating the constituent parts of units 90A, 90B and 90C. Similar items to those described in previous figures carry similar reference numerals and will not be described further. Each unit 90 contains the equivalent components to branch 84' of mirror circuit 86 (FIG. 8). Thus, units 90A, 90B and 90C respectively contain transistors 92A, 92B and 92C, NOR gates 100A, 100B and 100C and transistors 96A, 96B and 96C. Branch 82 is shown with transistors 91 and 94 and NOR gate 98. The size of transistors 92 and 96 are chosen so that units 90A–90C either alone or in combination cover the adjustment in $I_{mem}$ required to simulate the three possible options for the size of reference transistor 74 required (and current it passes).

The process of differentiating the memory transistors 50A–50D will be described further. In the first phase of sensing the disable ref unit signal is switched off by logic control unit 52, thereby enabling reference branch 82 of mirror circuit 86 via NOR gate 98. In the first phase of sensing the reference transistor 74 is of the correct size (the median value) for comparing between the two higher memory transistor sizes 50C and 50D and the two lower memory transistor sizes 50A and 50B respectively. Reference transistor 74 is, as described above, of a size 1.5*$W_{min}/L_{min}$ which is midway between the two smaller sized memory transistors (50A and 50B) and the two larger sized memory transistors (50C and 50D) (i.e. the size of reference transistor 74 is correct.) The current, $I_{mem}$, in branch 84 is therefore not adjusted in the first phase and $I_{mem}$ is equal to $I_{ref}$ at the start. This is achieved by switching on units 90A and 90B whose constituent transistors collectively pass a current of ⅓ $I_{ref}$ and ⅔ $I_{ref}$. This is achieved by signals disable 1 (dis 1) and disable 2 (dis 2) from logic control unit 52 to NOR gates 100A and 100B (via a connection) not being activated (going low). Signal disable 3 (dis 3) from logic control unit 52 is activated turning off unit 90C (⅔ $I_{ref}$). Since the current in branch 82 and branch 84 is mirrored, $V_m$ and $V_r$ are representative of the size of transistors in reference transistor 74 and memory transistor 50. If memory transistor 50A, 50B, 50C or 50D is larger in size than the size of reference transistor 74, the current differential upsets the balance of mirror circuit 86 and $V_m$ is less than $V_R$. Since memory branch 84 ($V_m$) is connected to the negative terminal of differential amplifier 88 and reference branch 82 ($V_R$) is connected to the positive terminal of differential amplifier 88, the output of differential amplifier 88 is 1, yielding an MSB of 1 as described further hereinbelow.

If $V_m$ is greater than $V_r$ as is the case when the size of memory transistor 50A–50D is less than the size of the reference transistor 74, the output from the differential amplifier 88 is 0, yielding an MSB of 0 as described further hereinbelow. Thus, memory transistor 50A and 50B yield an MSB of 0 and memory transistors 50C and 50D yield an MSB of 1 in the first phase.

In the second phase of sensing it is required to differentiate the LSB or the size (and current passed) between either the top two memory transistors 50C and 50D or the lower two memory transistors 50A and 50B, depending on which pair was chosen in phase 1. Thus, the size of reference transistor 74 (or the current it passes) must be changed to be between either the top two memory cells 50C and 50D i.e. 2.5*$W_{min}/L_{min}$ or between the lower two memory cells 50A and 50B i.e. 0.5*$W_{min}/L_{min}$. A further comparison is then made and if $V_m$ is less than $V_r$, the larger sized memory transistor 50 of the pair chosen in phase 1 is present, yielding an LSB of 1. Conversely, if $V_m$ is greater than $V_r$ the smallest sized memory transistor 50 of the pair chosen in phase 1 is present (and on LSB of 0 is chosen). Thus the sizes of memory transistors 50A–50D may be differentiated, yielding their MSB and their LSB.

Since the reference cell 74 is fixed at a size of 1.5*$W_{min}/L_{min}$, $I_{mem}$ is adjusted relative to $I_{ref}$ to simulate either a current of ⅓ $I_{ref}$ or 5/3 $I_{ref}$, corresponding to a size of reference transistor 74 of 0.5*$W_{min}/L_{min}$ or 2.5*$W_{min}/L_{min}$ as required. $I_{mem}$ for phase 2 with the small pair of memory transistors 50A (no transistor) and 50B is given by equation (1) below, where $W_{r\,(ph2,s)}$ is the required width of reference transistor 74 for phase 2, when the two smallest memory transistors 50A and 50B are chosen in phase 1. $I_{mem}$ for phase 2 with the larger pair of memory transistors 50C and 50D is given by equation (2) below, where $W_{r\ (ph2,b)}$ is the required width of the reference transistor 74 for phase 2 when the bigger pair of memory transistors 50C and 50C was chosen in phase 1. $W_{r\ (ph1)}$ is the width (or current carrying capacity) of reference transistor 74 in phase 1, i.e. the actual width required and not a simulated width.

$$I_{mem(ph2,a)} = I_{ref} \times \frac{W_{r(ph2,a)}}{W_{r(ph1)}} = \frac{0.5 * \frac{W_{min}}{L_{min}}}{1.5 * \frac{W_{min}}{L_{min}}} = \frac{1}{3} I_{ref} \qquad (1)$$

$$I_{mem(ph2,b)} = I_{ref} \times \frac{W_{r(ph2,b)}}{W_{r(ph1)}} = \frac{2.5 * \frac{W_{min}}{L_{min}}}{1.5 * \frac{W_{min}}{L_{min}}} = \frac{5}{3} I_{ref} \qquad (2)$$

The adjustment is made by either switching off unit 90B after phase 1, leaving only unit 90A (which passes ⅓ $I_{ref}$) connected, or, by switching on unit 90C after phase 1 which adds another ⅔ $I_{ref}$ to the already activated units 90A (⅓ $I_{ref}$) and 90B (⅔ $I_{ref}$), to give 5/3 $I_{ref}$. The appropriate current is thus achieved by logic control unit either switching on or off disable signals 1, 2 or 3 (dis 1, dis 2, dis 3) in response to an MSB of 1 or 0 in phase 1 of sensing, as described further hereinbelow.

Figure 10:
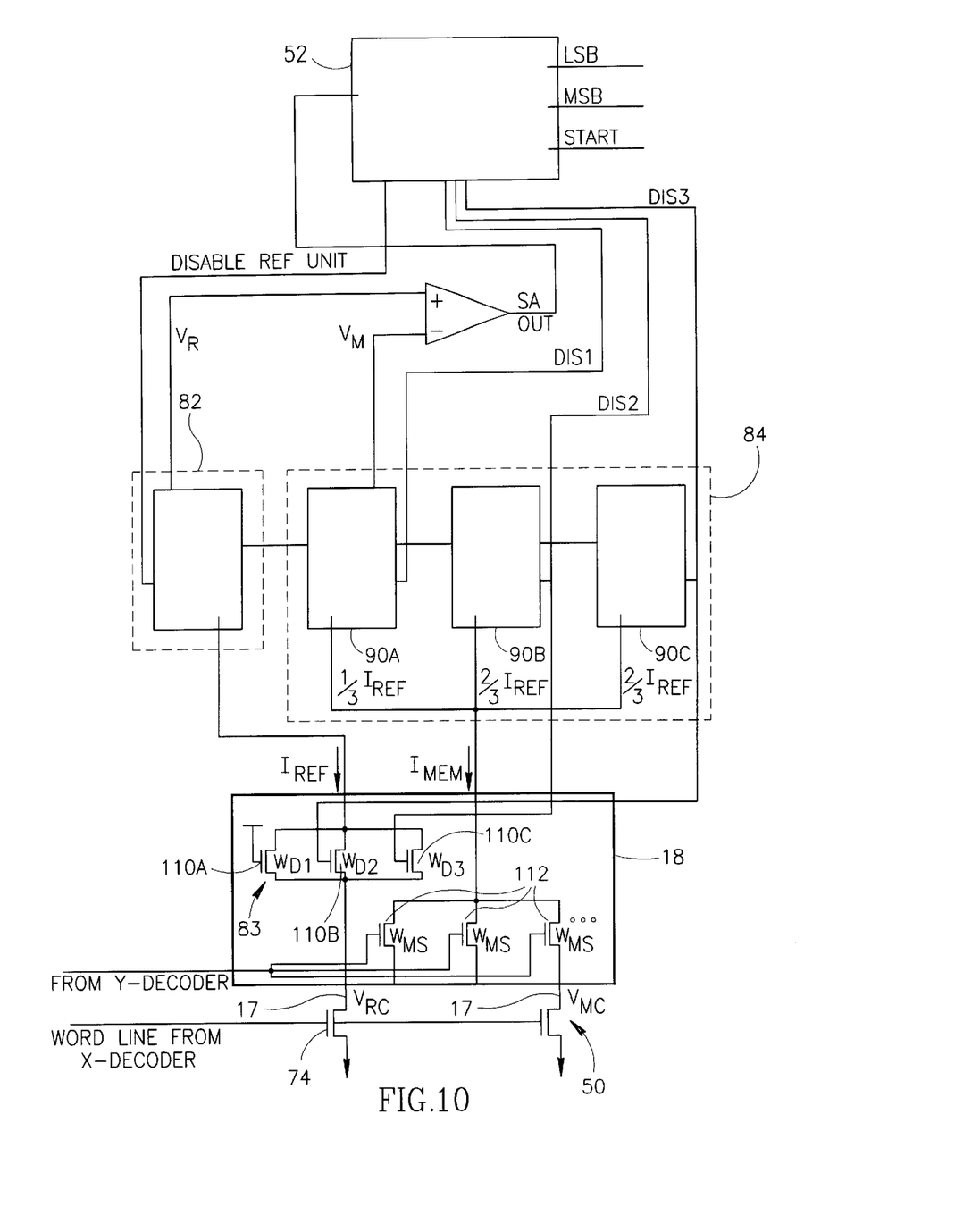
FIG. 10 is a schematic illustration of the circuitry of a dummy selector within the ROM in accordance with a preferred embodiment of the present invention.

Reference is now made to FIG. 10 which describes the operation of dummy selector 83. Similar items to those described in previous figures have similar reference numerals and will not be described further.

An adjustment must also be made for the additional voltage drop in bit line selector 18 when the current in memory branch 84 is adjusted in order to simulate changing reference transistor 74 between the phases in the manner described above. Dummy selector 83, which is connected to reference branch 82, contains three transistors 110A, 110B and 110C which are respectively connected to one another.

Their width (or current handling capacity) are designated $W_{d1}$, $W_{d2}$ and $W_{d3}$, respectively. Transistor $W_{d1}$ is always connected, whereas transistors $W_{d2}$ and $W_{d3}$ are connected when dis3 signal and dis2 signal respectively go high. dis 3 and dis 2 originate in logic control unit 52 and are communicated to transistors $W_{d2}$ and $W_{d3}$ via parallel connections to units 90C and 90B. Branch 84' is connected, via transistor 112 in bit line selector 18, to bit line 17 and memory transistor 50. As the current $I_{mem}$ increases or decreases in phases 1 and 2, the voltage drop on the bit line selector 18, increases or decreases accordingly. In order to balance this effect the dummy selector 83 in reference branch 82 is adjusted.

The overall size of transistors 110 in dummy selector 83 is varied to compensate so that the voltage drop on them also varies for phases 1 and 2 in accordance with equations (3), (4) and (5) below:

$$W_{d1} = \tfrac{3}{5} * W_{ns} \qquad (3)$$

$$W_{d1} + W_{d2} = W_{ns} \qquad (4)$$

$$W_{d1} + W_{d2} + W_{d3} = 3 * W_{ns} \qquad (5)$$

The compensation effect may be described in the following way. During the first phase where there is no current adjustment and $I_{mem}$ is equal to $I_{ref}$ dis 3 is high so unit 90C is off and transistor 110B of width $W_{d2}$ is on. Transistor 110B is connected to dis 3 in parallel with unit 90C. Further, during phase 1, transistor 110A of width $W_{d1}$ is also on (as it is always on) and furthermore transistor 110C of width $W_{d3}$ is off because dis2 which is connected in parallel to unit 90B is low (and unit 90B is on). Thus, in phase 1, equation (4) must be satisfied to equalize the voltage drop in both branches 82 and 84, as described hereinabove.

However, if after phase 1, the current $I_{mem}$, should increase to 5/3 $I_{ref}$ instead of $I_{ref}$, this would be achieved by signal dis 3 going low (to 9). This turns on unit 90C and turns off transistor 110B of width $W_{d2}$, leaving only transistor 110A of width $W_{d1}$ connected in dummy selector 83. Since the current in memory branch 84 is 5/3*$I_{mem}$, to simulate that voltage drop, transistor 110A of width $W_{d1}$ must be decreased in size by that proportion. Equation (3) therefore covers this scenario.

If, however, the current $I_{mem}$ in memory branch 84 should decrease in phase 2 to ⅓*$I_{ref}$ then dis2 signal will go high turning unit 90B off and transistor 110C of width $W_{d3}$ on. All the transistors 110A–110C will now be on to form the largest transistor. In this case, since the current $I_{mem}$ in memory branch 84 is decreased to ⅓ $I_{ref}$ the combined transistors 110 should be increased in size by a factor of 3 in order to compensate for the voltage increase across transistors 110. Hence, equation (5).

Equations (2), (4) and (5) yield the following relationships:

$$W_{d1} = \tfrac{3}{5} * W_{ns}$$

$$W_{d2} = \tfrac{2}{5} * W_{ns}$$

$$W_{d3} = 2 * W_{ns} \qquad (6)$$

Figure 11:
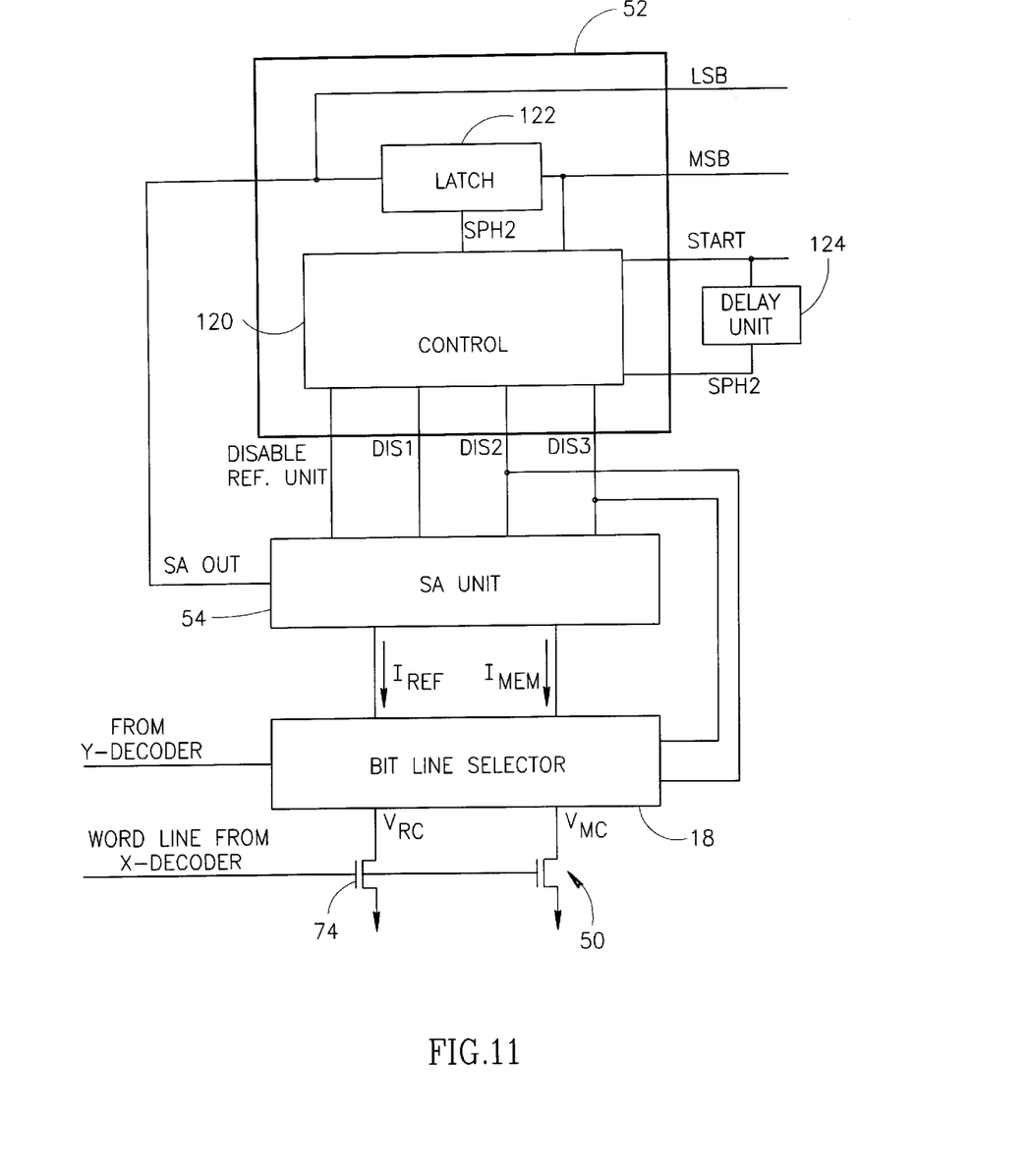
FIG. 11 is a schematic illustration of logic control unit as part of the ROM in accordance with a preferred embodiment of the present invention.

Reference is now made to FIG. 11 which illustrates logic control unit 52 as part of the ROM in accordance with an embodiment of the present invention. FIG. 9 which illustrates the circuitry of the ROM in accordance with an embodiment of the invention is once again referred to. Similar items to those referred to in previous figures carry similar reference numerals and will not be described further.

The function of logic control unit 52 is to move sense amplifier 54 from phase to phase and to determine the final value of the two bits. Logic control unit 52 comprises a control 120, connected to NOR gates 100A, 100B and 100C of branch unit 90A, unit 90B and unit 90C, respectively conveying signals dis1, dis2 and dis3, as described hereinabove (FIG. 9). When signal dis 1, dis 2 or dis 3 goes high, its respective unit 90A–90C (FIG. 9) is disconnected. Control 120 is further connected to transistor 110B (dis 3) and transistor 110C (dis 2) of dummy selector 83, as described hereinabove (FIG. 10). Control unit 120 is also connected to NOR gate 98 for disconnecting reference branch 82 of sensing amplifier 54 via a disable reference unit command (FIG. 9). Control unit 120 is connected to a latch 122 which is itself connected to the output of differential amplifier 88 (or SA out) for registering the MSB and LSB for each sensing phase. The LSB and MSB may then be outputted. Control 120 is also connected to a delay unit 124.

Phase 1 starts with the rising edge of the start signal. At this point signals dis 1, dis2 and disable ref unit will go low to start phase 1. This activates unit 90A, Unit 90B and reference branch 82, as described hereinabove. The end of phase one is determined by the rising edge of the start phase two (sph2) signal which is fed to the control unit 120 from delay unit 124. The delay unit 124 is made from a dummy sense amplifier that emulates the worst delay conditions of the regular sense amplifiers. Thus, the end of phase 1 and the beginning of phase 2 may be determined with high accuracy.

At the end of phase 1, the result output (SA out) by differential amplifier 88 is latched by latch 122. This result is the stored MSB and also the current change command to control 120, which determines whether the current should be increased or decreased. The relevant signal dis2 or dis3 will be changed by control 120 at the start of phase 2 to achieve this current change, as described hereinabove. When phase 2 is completed, the output of the differential amplifier (SA out) is latched by latch 122 to give the LSB. Both data bits may then be stored in registers (not shown).

Figure 12A:
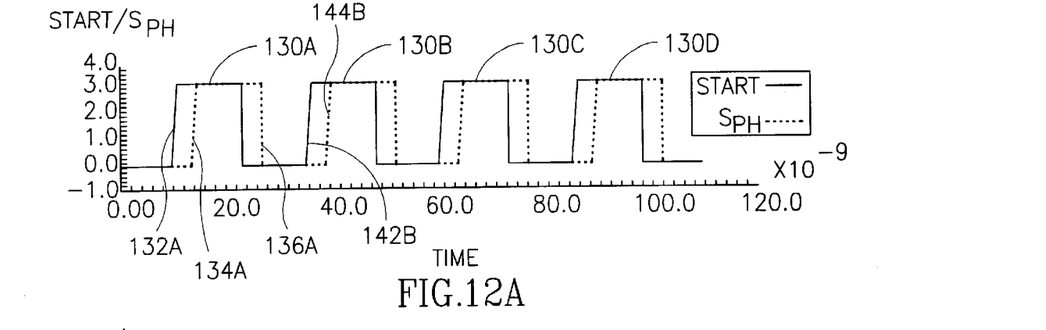
FIGS. 12A–12D are graphical illustrations of a HSpice™ simulation program for the ROM of the preferred embodiment at 3.3V and 25 degrees Celsius.
Figure 12B:
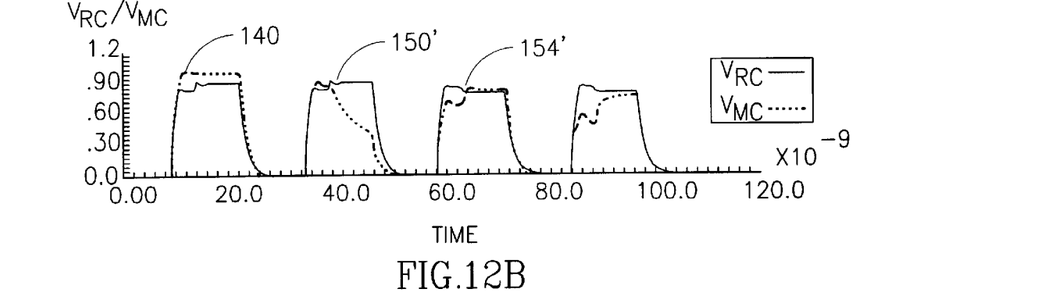
Figure 12C:
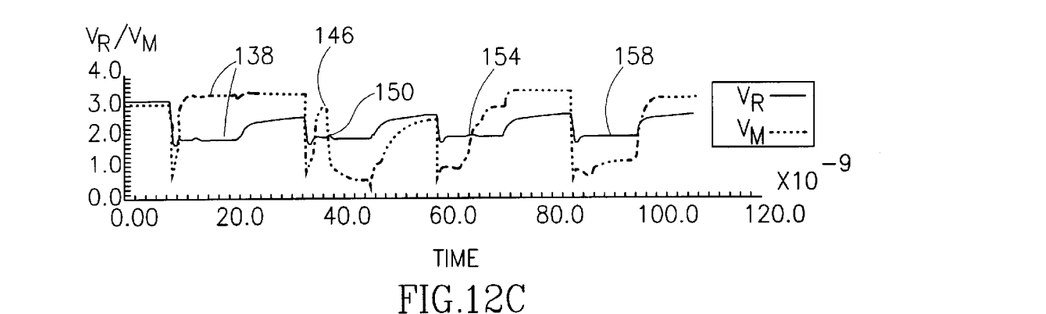
Figure 12D:
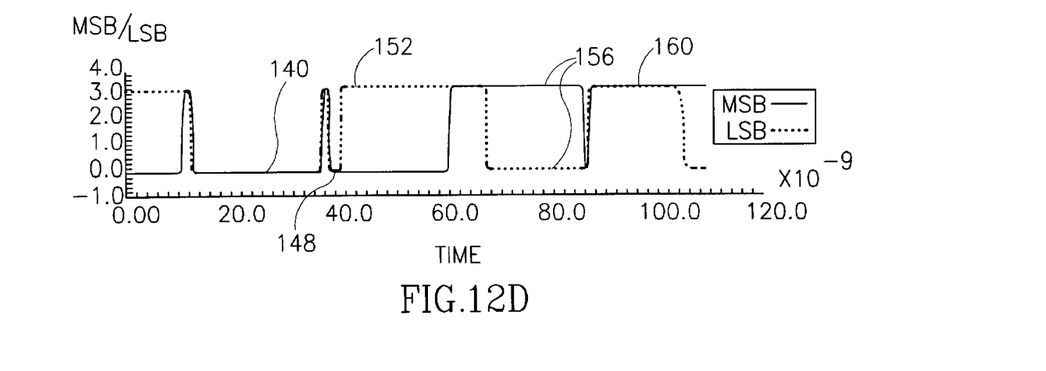

Reference is now made to FIGS. 12A–12D which illustrate the characteristics of ROM 70 in accordance with a Hspice™ simulation at 3.3V and 25 degrees Celsius. FIG. 12A shows the start signal (solid line) and the start phase 2 signal (broken line), varying with time. FIG. 12B illustrates $V_{rc}$, (solid line) and $V_{mc}$ (broken line) which are the voltages at the reference transistor 74 and the memory transistor 50 respectively for the same time period as FIG. 12A. FIG. 12C illustrates $V_r$ (solid line) and $V_m$ (broken line) the voltages in branches 82 and 84 of sensing amplifier 54 (FIG. 9) respectively for the same time period. FIG. 12D illustrates the corresponding MSB (solid line) and LSB (broken line) detected for the same time period. Four specific sensing cycles 130A–130D are indicated by four start signals and four start phase 2 signals are shown on FIG. 12A. The four cycles correspond to bit combinations 00,01,10 and 11 and memory transistors 50A, 50B, 50C and 50D respectively. Corresponding time periods in each of FIGS. 12A–12D correspond respectively to the sensing of each particular bit combination (or memory transistor 50A–50D)

Referring to FIG. 12A, a start signal 132A is given and within the period before sph2 signal begins $V_r$, and $V_m$ attain a steady state (FIG. 12C), $V_r$ is less than $V_m$ at plateaus 138 (FIG. 12C) and remains so from the start phase 2 signal 134A to the end phase 2 signal 136A (FIG. 12A). Thus a 00 bit is detected at trough 140 (FIG. 9D). It can be seen on plateau 140 of FIG. 12B that $V_{rc}$ and $V_{mc}$ follow $V_r$ and $V_m$ but in a less pronounced manner and the differential between them is less.

For the second sensing cycle 130B (FIG. 12A) starting signal and start phase 2 (sph2) are shown at 142B and 144B respectively. $V_m$ is again greater than $V_r$ for he first phase at point 146 (FIG. 12C) yielding an MSB of 0 at point 148 (FIG. 12D). However, at the start of the second phase at 144B (FIG. 12A), $V_m$ plunges beneath $V_r$ at crossing point 150 (FIG. 12C), yielding an LSB of 1 for the second phase, shown at point 152 (FIG. 12D). The last two simulations 130C and 130D yield a 1 0 and a 1 1 bit set, the relative voltages in each phase determining the bits (FIG. 12D). Again, a crossover point 154 (FIG. 12C) is associated with an output containing two different bits in the third simulation 130C (FIG. 12A). This time, however $V_m$ shoots up from below $V_r$ where it is initially, so this is a 1 0 bit combination as shown by positions 156 on FIG. 12D.

It should be noted that crossover points 150 and 154 (FIG. 12C) are reflected also in the relationship of $V_{rc}$ and $V_{mc}$ at points 150' and 154' (FIG. 12B). The final sensing cycle 130D (FIG. 9A) yields no crossover point (FIG. 12C) as there is no 'change of bit' between the first and second phases. However, $V_m$ is always less than $V_r$ (see trough 158 of FIG. 12C) in this case, conversely to the first sensing cycle 130A, and thus 1's are yielded as the MSB and LSB, as shown by plateau 160 of FIG. 12D.

It should be noted that the above example is merely exemplary and that more bits can be stored in a cell 43 of a ROM array 72 of a ROM 70, in accordance with the invention. The limiting factors include the ability of sense amplifier 54 to differentiate between greater than four different sizes of memory transistors 50 and also the ability to maintain accuracy by maintaining a measurable size differential in terms of sensing. For example, 4 bits may be sensed with 16 different sizes of memory transistors 50. In general N bits may be sensed by $2^N$ different sizes of memory transistors 50.

It will be appreciated, by persons skilled in the art, that the present invention is not limited by what has been particularly shown and described hereinabove. Rather the scope of the invention is defined by the claims that follow:

What is claimed is:

1. A read only memory (ROM) comprising:

an array, said array comprising a plurality of cells having operative elements having $2^N$ sizes, each of said cells adapted for storing N bits and each cell having one said operative element;

a current sensing circuit in operative communication with said array for sensing the size of at least one of said operative elements of said array and for differentiating among said sizes to determine the values of said N bits of said plurality of cells; and N is greater than 1.

2. The read only memory of claim 1, wherein each operative element comprises a transistor.

3. The read only memory of claim 1, wherein said current sensing circuit comprises:

a comparator including a first branch and a plurality of second branches, each branch of said plurality of said second branches carries a current;

a reference cell having a predetermined current level, said reference cell in communication with said first branch; and a bit line selector selectively connectable to at least one of said second branches.

4. The read only memory of claim 3, wherein said plurality of second branches includes at least one branch.

5. The read only memory of claim 3, wherein said one first branch includes at least one transistor.

6. The read only memory of claim 3, wherein each of said second branches includes at least one transistor.

7. The read only memory of claim 6, wherein each of said at least one transistors is connected to at least one other transistor.

8. A read only memory (ROM) array comprising:

a plurality of cells, each of said cells adapted for storing N bits and each cell containing an operative element sized so as to have one of $2^N$ sizes; and N is an integer greater than 1.

9. The read only memory of claim 8, additionally comprising:

a current sensing circuit in operative communication with said array for sensing the size of at least one of said operative elements of said array and for differentiating among $2^N$ of said sizes to determine the values of each bit of said N bits of said plurality of cells.

10. The read only memory of claim 8, wherein each of said operative elements comprises a transistor.

11. The read only memory of claim 9, wherein said current sensing circuit comprises:

a comparator including a first branch and a plurality of second branches, each branch of said plurality of said second branches carries a current;

a reference cell having a predetermined current level, said reference cell in communication with said first branch; and a bit line selector selectively connectable to at least one of said second branches.

12. The read only memory of claim 11, wherein said plurality of second branches includes at least one branch.

13. The read only memory of claim 12, wherein said one first branch includes at least one transistor.

14. The read only memory of claim 11, wherein each of said second branches includes at least one transistor.

15. The read only memory of claim 14, wherein each of said at least one transistor is connected to at least one other transistor.

16. A method for accessing N bits per cell in a read only memory (ROM) where N is greater than 1 comprising:

forming an array said array comprising a plurality of cells, each of said cells adapted for storing N bits and each cell having an operative element sized so as to have one of $2^N$ sizes; and sensing the size of at least one of said operative elements of said array; and differentiating among $2^N$ of said sizes to determine the values of each bit of said N bits of said plurality of cells.

17. The method of claim 16 wherein said step of differentiating comprises:

recursively splitting said $2^N$ sizes into a larger half and a smaller half; and recursively isolating a chosen half of said larger and said smaller half containing said at least one of said operative elements;

wherein said recursive splitting and said recursive isolating occurs N+1 times.

18. The method of claim 17 wherein said step of recursively isolating includes recursively measuring a voltage drop through said at least one operative element representative of the relative sizes of a median size between said larger half and said smaller half and of said at least one operational element.

19. The method of claim 16 wherein said step of forming includes forming an array said array comprising a plurality of cells, each of said cells adapted for storing N bits and each cell having a transistor sized so as to have one of $2^N$ sizes.

* * * * *